United States Patent [19]
Obara

[11] Patent Number: 5,406,566
[45] Date of Patent: Apr. 11, 1995

[54] SEMICONDUCTOR MEMORY DEVICE HAVING DIAGNOSTIC CIRCUIT FOR COMPARING MULTI-BIT READ-OUT TEST DATA SIGNAL WITH MULTI-BIT WRITE-IN TEST DATA SIGNAL STORED IN SERIAL-INPUT SHIFT REGISTER

[75] Inventor: Takashi Obara, Tokyo, Japan

[73] Assignee: NEC Corporation, Tokyo, Japan

[21] Appl. No.: 139,717

[22] Filed: Oct. 22, 1993

[30] Foreign Application Priority Data

Oct. 26, 1992 [JP] Japan ................. 4-287229

[51] Int. Cl.6 ........................................... G01R 31/28
[52] U.S. Cl. ...................................... 371/21.2; 371/27
[58] Field of Search ................... 371/15.1, 21.1, 21.2, 371/21.3, 24, 25.1, 27

[56] References Cited

U.S. PATENT DOCUMENTS

| | | |
|---|---|---|
| 4,757,215 | 7/1988 | Seo . |
| 4,872,168 | 10/1989 | Aadsen et al. .............. 371/21.3 |
| 4,967,387 | 10/1990 | Shibasaki et al. ............ 371/16.1 |
| 5,057,819 | 10/1991 | Tanaka et al. . |
| 5,072,137 | 12/1991 | Slemmer ..................... 371/21.1 |
| 5,148,398 | 9/1992 | Kohno ........................ 371/21.1 |
| 5,224,101 | 6/1993 | Popyack, Jr. ................ 371/21.1 |
| 5,231,605 | 7/1993 | Lee ............................ 371/25.1 |
| 5,233,610 | 8/1993 | Nakayama et al. ........... 371/5.1 |
| 5,239,509 | 8/1993 | Ikawa et al. ................ 371/21.1 |
| 5,258,954 | 11/1993 | Furuyama ................... 371/21.1 |
| 5,265,100 | 11/1993 | McClure et al. ............. 371/21.1 |
| 5,267,206 | 11/1993 | Koyabu ...................... 371/21.2 |
| 5,271,015 | 12/1993 | Akiyama ..................... 371/21.5 |
| 5,278,839 | 1/9194 | Matsumoto et al. .......... 371/10.2 |
| 5,291,449 | 3/1994 | Dehara ....................... 371/21.1 |
| 5,303,192 | 4/1994 | Baba .......................... 371/21.1 |

*Primary Examiner*—Robert W. Beausoliel, Jr.
*Assistant Examiner*—Albert Decady
*Attorney, Agent, or Firm*—Sughrue, Mion, Zinn, Macpeak & Seas

[57] ABSTRACT

A dynamic random access memory device is subjected to a diagnosis upon completion of fabrication to see whether or not a defective memory cell is incorporated in memory cell sub-arrays, one of the input/output data buffer circuits incorporated therein transfers test bits in serial to a shift register which in turn transfers the test bits in parallel to data line pairs for writing the test bits into the memory cell sub-arrays, and a comparator compares the test bits read out from the memory cell sub-arrays with the test bit stored in the shift register for producing a diagnostic signal indicative of consistence or inconsistence between the test bits read out from the memory cell sub-arrays and the test bits in the shift register, thereby allowing an external diagnostic system with data pins less than the input/output data buffer circuits to carry out the diagnosis.

6 Claims, 7 Drawing Sheets

SEMICONDUCTOR MEMORY DEVICE HAVING DIAGNOSTIC CIRCUIT FOR COMPARING MULTI-BIT READ-OUT TEST DATA SIGNAL WITH MULTI-BIT WRITE-IN TEST DATA SIGNAL STORED IN SERIAL-INPUT SHIFT REGISTER

FIELD OF THE INVENTION

This invention relates to a semiconductor memory device and, more particularly, to a diagnostic circuit incorporated in the semiconductor memory device for diagnosing memory cells.

DESCRIPTION OF THE RELATED ART

Most of the semiconductor memory devices, such as a dynamic random access memory device, have an interface unit for a single-bit input/output data signal or a four-bit input/output data signal. For a standard 1 mega-bit dynamic random access memory device with a single-bit interface, the data bits stored in the memory cell array are, by way of example, accessible at 80 nanoseconds, and the minimum cycle time is about 150 nanoseconds.

When the 1 mega-bit dynamic random access memory devices are fabricated through a process sequence, the memory cells are subjected to inspections to see whether or not any potential defects are incorporated therein. A test data bit of either logic "1" or "0" level is simply written into and read out from the memory cells during one of the inspections, and the simple inspection consumes about 1.4 seconds. The manufacturer makes inspections on not only the memory cell array but also the other component units such as a built-in refreshing system, and total time period for the inspections is never ignoreable.

The dynamic random access memory device progressively increases the memory capacity, and the increased memory capacity prolongs the time period for the inspections. For example, the simple inspection for a 4 mega-bit dynamic random access memory device is prolonged from 1.4 seconds to 5.7 seconds, and the complicate circuit arrangement drastically prolongs the total time period for the inspections.

One of the approaches against the prolonged time period for the inspections is a parallel testing sequence. Built-in testing circuits allows an external diagnostic system to carry out inspections on the memory cells in a parallel fashion, and shrinks the total time period for the inspections.

Another background of the present invention is a parallel access. The 1-megabit to 4-megabit generation incorporates a 16-bit data interface therein, and the next generation will incorporate a 32-bit data interface and a 36-bit data interface for 32-bit data code with 2 parity-bits. Such an increased parallel access is matched with the parallel processing on a microprocessor, and enhances the processing speed, a space utility and simplicity of the arrangement of peripheral circuits. Thus, the parallel access is one of the recent tendencies of the data processing field.

A typical example of the dynamic random access memory device is illustrated in FIG. 1 of the drawings, and comprises a plurality of addressable memory cells arranged in a memory cell array 10, a plurality of read/write data amplifier circuits 21, 22, ... and 2m coupled with the memory cell array 10 for amplifying read-out data bits and write-in data bits in the form of potential difference, a plurality of input/output data buffer circuits 31, 32, ... and 3m for converting the read-out data bits and the write-in data bits between the potential differences and a multi-bit input/output data signal, a plurality of data line pairs 41, 42, ... and 4m coupled between the read/write data amplifier circuits 21 to 2m and the input/output data buffer circuits 31 to 3m, and a plurality of input/output data pins 51, 52, ... and 5m coupled with the input/output data buffer circuits 31 to 3m. In the next generation, m may be 16, 32 or 36.

A microprocessor (not shown) transfers m-bit data signal to the input/output data pins 51 to 5m, and the input/output data buffer circuits 31 to 3m, simultaneously produce m potential differences on the data line pairs 41 to 4m from the m-bit data signal. The m potential differences are amplified by the read/write data amplifier circuits 21 to 2m, and are transferred to the memory cell array 10 so that m memory cell sub-arrays respectively store the m data bits.

When the microprocessor accesses data information indicated by the m data bits, an addressing system (not shown) of the dynamic random access memory device specifies an address of the memory cell array 10, and the m data bits are concurrently read out from the m memory cell sub-arrays to the read/write data amplifier circuits 21 to 2m. The m data bits in the form of potential difference are amplified, and the potential differences are propagated through the data line pairs 41 to 4m to the input/output data buffer circuits 31 to 3m. The input/output data buffer circuits 31 to 3m, produces an m-bit output data signal from the potential differences, and delivers the m-bit output data signal from the input/output data pins 51 to 5m to the microprocessor.

Thus, the dynamic random access memory device is directly communicable with the m-bit microprocessor, and the parallel access improves an access speed per bit.

As described hereinbefore, the increased memory capacity prolongs the time period for the inspections, and the parallel testing sequence is effective against the prolonged time period. However, the parallel testing sequence is available for the dynamic random access memory device as long as the multi-bit interface thereof is equal in the number of pins to or less than the interface of the diagnostic system. If the manufacturer enhances the parallel access, the parallel testing sequence can not fully demonstrate the ability. Of course, if new diagnostic systems are installed for every generation, the parallel testing sequence is effective against the prolonged time period. However, such a frequent renewal is very expensive.

SUMMARY OF THE INVENTION

It is therefore an important object of the present invention to provide a semiconductor memory device which allows a parallel testing sequence to fully demonstrate the ability without renewal of a diagnostic system.

To accomplish the object, the present invention proposes to internally carry out a serial-to-parallel conversion.

In accordance with the present invention, there is provided a semiconductor memory device selectively entering a standard mode and a diagnostic mode of operation, comprising: a) a plurality of memory cell arrays each having a plurality of addressable memory cells; b) an addressing system selecting one of the plurality of addressable memory cells from each of the plurality of memory cell arrays; c) a data propagation system having c-1) a plurality of first data bus means associated with the plurality of memory cell arrays, and respectively propagating data bits and test bits from and to the plurality of memory cell arrays in both standard and diagnostic modes of operation, c-2) a plurality of second data bus means respectively connectable with the plurality of second data bus means, c-3) a switching means operative to isolate the plurality of first data bus means from the plurality of second data bus means in the diagnostic mode and to transfer the data bits between the plurality of first data bus means and the plurality of second data bus means in the standard mode, and c-4) an input/output means operative to transfer the data bits in parallel to the plurality of second data bus means in the standard mode and to selectively transfer the test bits in serial to the plurality of second data bus means; and d) a diagnostic system having d-1) a controller responsive to external control signals for controlling a test sequence carried out in the diagnostic mode, d-2) a write register coupled with predetermined second data bus means supplied in serial with the test bits, and storing the test bits, the test bits being supplied in parallel to the plurality of first data bus means for writing the test bits into the memory cells respectively selected from the plurality of memory cell arrays in the diagnostic mode, and d-3) a comparator operative to compare the test bits read out in parallel from the plurality of memory cell arrays to the plurality of first data bus means with the test bits stored in the write register in the diagnostic mode to see whether or not the test bits on the plurality of first data bus means are consistent with the test bits in the write register, and supplying a diagnostic signal indicative of consistence or inconsistence to the predetermined second data bus means for outputting the diagnostic signal through the input/output means.

BRIEF DESCRIPTION OF THE DRAWINGS

The features and advantages of the semiconductor memory device according to the present invention will be more clearly understood from the following description taken in conjunction with the accompanying drawings in which.

DESCRIPTION OF THE PREFERRED EMBODIMENTS

First Embodiment

Figure 1:
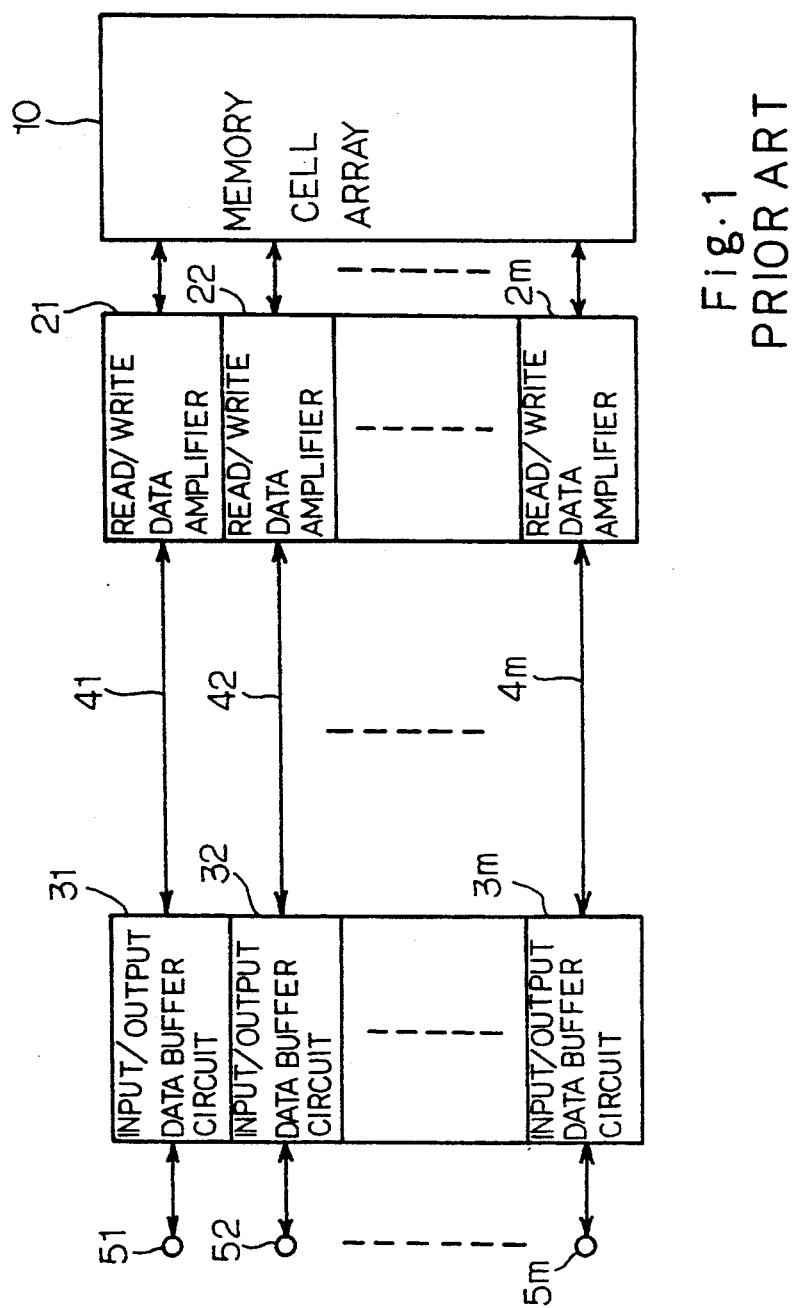
FIG. 1 is a block diagram showing the arrangement of the prior art dynamic random access memory device.
Figure 2:
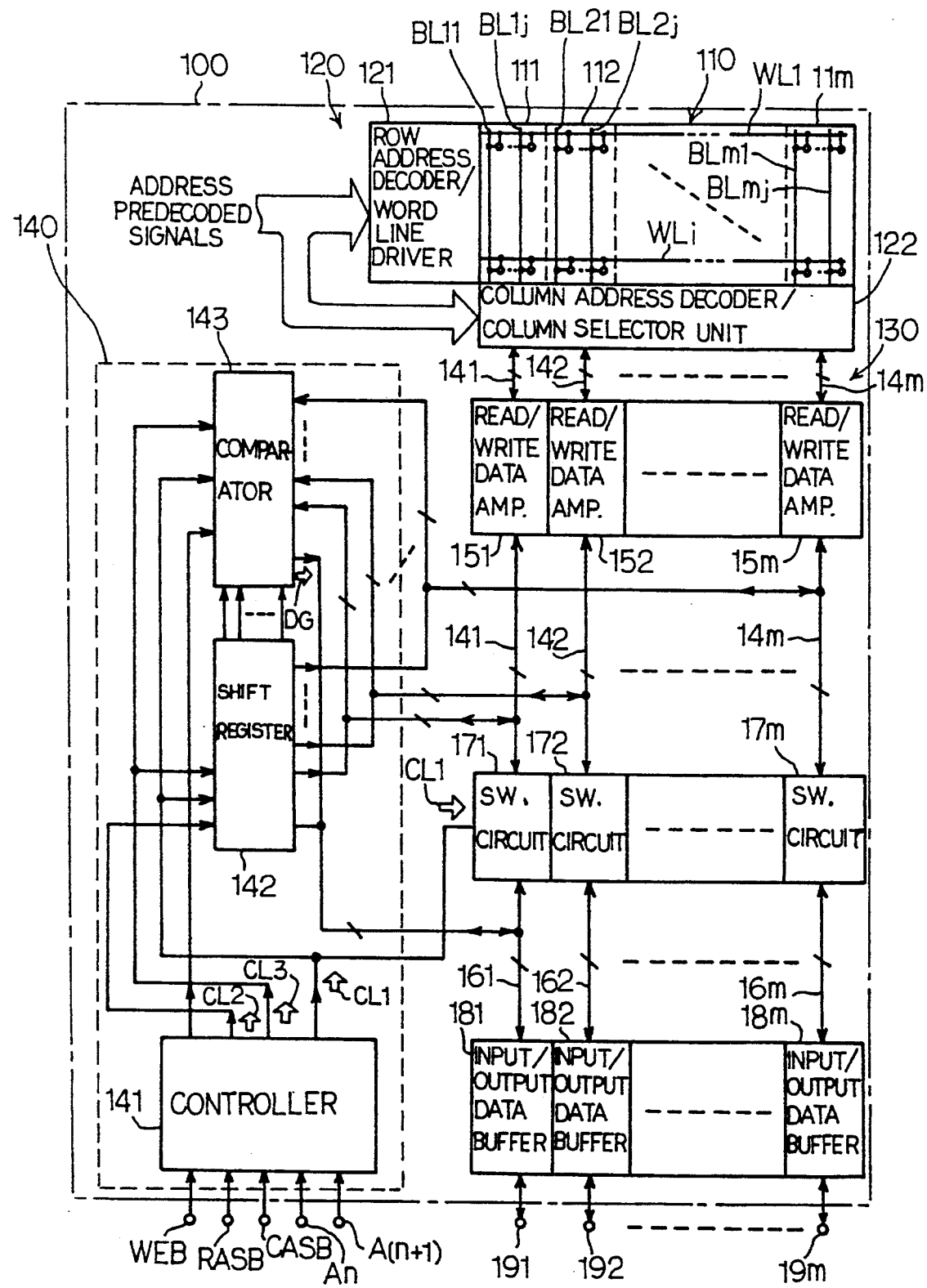
FIG. 2 is a block diagram showing the arrangement of a dynamic random access memory device according to the present invention.

Referring to FIG. 2 of the drawings, a dynamic random access memory device is fabricated on a single semiconductor chip 100, and largely comprises a memory cell array 110, an addressing system 120, a data propagation system 130 and a diagnostic system 140. Although other systems are further incorporated in the dynamic random access memory device, FIG. 1 does not show them, because they are less important for understanding the present invention.

Upon completion of the fabrication, the dynamic random access memory device is subjected to various inspections through testing sequences under the control of the diagnostic system 140. One of the testing sequences is available for checking the memory cell array 110 to see whether or not a defective memory cell is incorporated in the memory cell array 110. Another testing sequence is used for checking the data holding characteristics of the memory cell array 110, and a refreshing sequence is checked through yet another testing sequence.

After installation of the dynamic random access memory device in an electronic system, m-bit data are written into the memory cell array 110 through a write-in sequence, and the m-bit data are read out therefrom through a read-out sequence. The write-in sequence and the read-out sequence are carried out in a write-in mode and a read-out mode, and the write-in mode and the read-out mode form a standard mode of operation.

The memory cell array 110 is broken down into m memory cell sub-arrays 111, 112, ... and 11m, and each of the memory cell sub-arrays 111 to 11m is implemented by memory cells respectively represented by small circles. A plurality of word lines WL1 to WLi are shared between the memory cell sub-arrays 111 to 11m, and are coupled with the rows of memory cells of the memory cell sub-arrays 111 to 11m for making the rows of memory cells selectively accessible. A plurality of bit line pairs BL11 to BL1j, BL21 to BL2j, ... and BLm1 to BLmj are associated with the columns of memory cells of the memory cell sub-arrays 111 to 11m, and propagate data bits in the form of potential difference to and from the accessible rows of memory cells.

The addressing system 120 comprises a row address decoder/word line driver unit 121 responsive to row address predecoded signals and a column address decoder/column selector unit 122 responsive to column address predecoded signals. The row address decoder/word line driver unit 121 selectively drives the word lines WL1 to WLi, and couples the memory cells associated therewith with the bit line pairs BL11 to BLmj. The column address decoder/column selector unit 122 selects one of the bit line pairs from each bit line pair group BL11/BL1j, BL21/BL2j ... or BLm1/BLmj, and the data bits are transferred between the selected bit line pairs and the data propagation system 130.

The data propagation system 130 comprises a plurality of first data line pairs 141, 142, ... and 14m, a plurality of read/write data amplifier circuits 151, 152... and 15m coupled with the first data line pairs 141 to 14m, a plurality of second data line pairs 161, 162... and 16m, a plurality of switching circuits 171, 172, ... and 17m coupled between the first data line pairs 141 to 14m and the second data line pairs 161 to 16m, and a plurality of input/output data buffer circuits 181, 182 ... and 18m coupled between the second data line pairs 181 to 18m and input/output data pins 191, 192, ... and 19m.

Potential differences indicative of the data bits on the first data line pairs 141 to 14m are increased in magnitude by the read/write data amplifier circuits 151 to 15m, and are propagated on the first data line pairs 141 to 14m between the column address decoder/column selector unit 122 and the transfer gates 171 to 17m.

Figure 3:
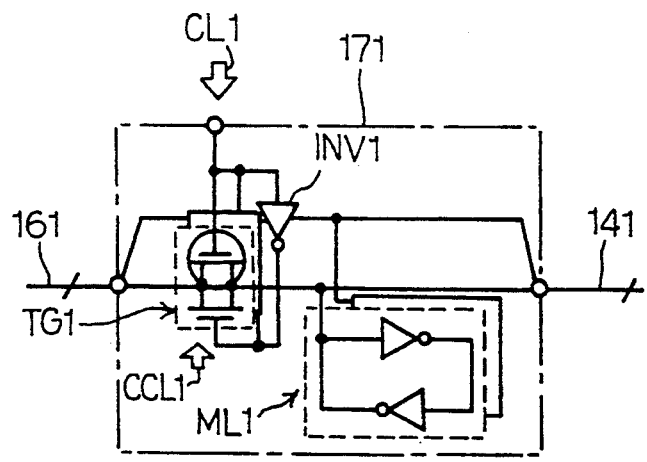
FIG. 3 is a circuit diagram showing the circuit arrangement of a switching circuit incorporated in the dynamic random access memory device according to the present invention.

All of the switching circuits 171 to 17m are similarly arranged, and the switching circuit 171 is, by way of example, illustrated in FIG. 3. The switching circuit 171 comprises a pair of transfer gates TG1, i.e., parallel combinations of p-channel enhancement type switching transistors and n-channel enhancement type switching transistors coupled in parallel between the first data line pair 141 and the second data line pair 161, an inverter INV1 for producing the complementary signal CCL1 of a first test control signal CL1, and a pair of memory loops ML1 coupled with the first data line pair 141. The first test control signal CL1 and the complementary signal thereof CCL1 are supplied to the pair of transfer gates TG1 so that the first data line pair 141 is conducted with or blocked from the second data line pair 161. The pair of memory loops ML1 is implemented by two pairs of inverters, and the output node of one of the inverters of each pair is coupled with the input node of the other of the inverters. Therefore, the potential difference on the first data line pair 141 is stored in the two pairs of inverters. In summary, all of the switching circuits 171 to 17m are responsive to the first control signal CL1 from the diagnostic system 140 for coupling the first data line pairs 141 to 14m with the second data line pairs 161 to 16m, and the potential differences on the first data line pairs 141 to 14m are temporally stored in the switching circuits 171 to 17m, respectively.

Turning back to FIG. 2, while the dynamic random access memory device is staying in the write-in mode for the write-in sequence, input data signals indicative of an m-bit data is transferred from the input/output data pins 191 to 19m, and the input/output data buffer circuits 181 to 18m produces potential differences on the second data line pairs 161 to 16m from the input data signals. On the other hand, while the read-out mode for the read-out sequence is being established in the dynamic random access memory device, the input/output data buffer circuits 181 to 18m produces output data signals indicative of the m-bit data from the potential differences on the second data line pairs 161 to 16m, and the output data signals are supplied from the input/output data buffer circuits 181 to 18m to the input/output data pins 191 to 19m.

As will be described in conjunction with the diagnostic system 140, while the dynamic random access memory device is being subjected to an inspection of the memory cell array 110 through a testing sequence, an m-bit test data bits are supplied in serial from an external diagnostic system (not shown) to the input/output data pin 191, and the associated input/output data buffer circuit 181 sequentially produces potential differences.

The diagnostic system 140 comprises a controller 141, a shift register 142 and a comparator 143. The controller 141 is responsive to external test control signals applied to control pins WEB, RASB and CASB as well as to address pins An and A(n+1), and produces second and third test control signals CL2 and CL3 as well as the first test control signal CL1. The external test control signal at the address pin An exceeds the positive power voltage level Vdd in the diagnostic mode, and the address pin A(n+1) over the positive power voltage level releases the dynamic random access memory device from the diagnostic mode.

The shift register 142 is reset with the first test control signal CL1, and sequentially shifts the m-bit test data from stage to stage in response to the second test control signal CL2. When the third test control signal CL3 is changed to active level, the shift register 142 supplies the m-bit test data in parallel to the first data line pairs 141 to 14m.

The comparator 143 is enabled with the first test control signal CL1, and compares the m-bit test data on the first data line pairs 141 to 14m with the m-bit test data in the shift register 142 to see whether or not the m-bit test data are consistent with each other. The comparator 143 is further responsive to the third test control signal CL3 for supplying a diagnostic signal DG indicative of consistence or inconsistence between the m-bit test data to the second data line pair 161. The diagnostic signal DG is supplied to the input/output data buffer 191, and reports the diagnosis to the external diagnostic system (not shown).

Figure 4:
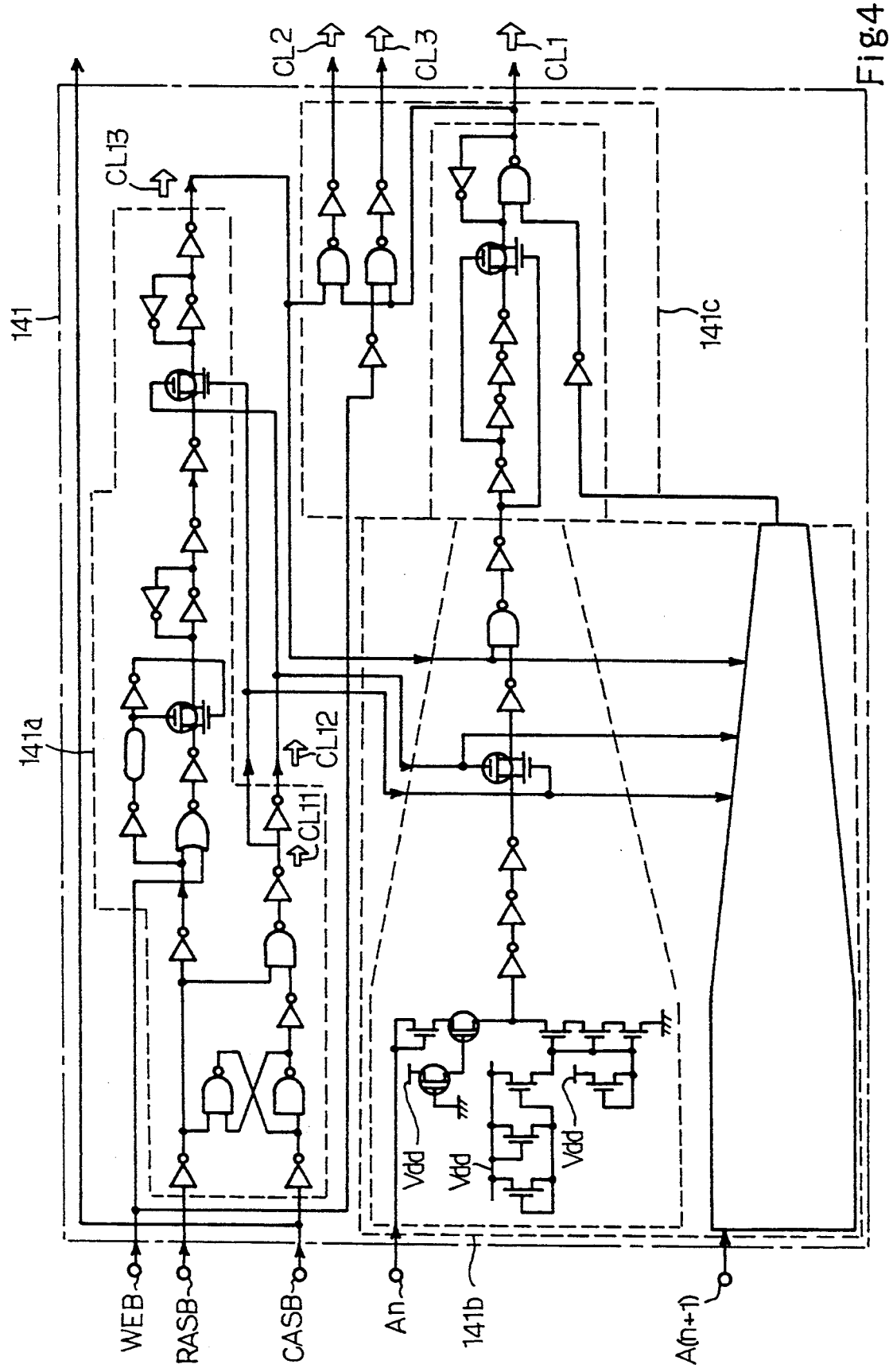
FIG. 4 is a circuit diagram showing the circuit arrangement of a controller incorporated in the dynamic random access memory device according to the present invention.

Turning to FIG. 4 of the drawings, the controller 141 comprises a mode discriminating circuit 141a, an excess voltage discriminating circuit 141b and a signal producing circuit 141c. The mode discriminating circuit 141a monitors the control signal pins WEB, RASB and CASB, and produces control signals CL11, CL12 and CL13 when the external control signals at the control signal pins WEB, RASB and CASB form a predetermined pattern indicative of the diagnostic mode. The predetermined pattern is referred to as "Write-CAS-Before-RAS Timing", and the control signals at the signal pins WEB and CASB go down before the step-down of the control signal at the signal pin RASB for the diagnostic mode. When the excess voltage discriminating circuit 141b acknowledges the voltage level over the positive power voltage level, the discriminating circuits 141a and 141b allows the dynamic random access memory device to enter the diagnostic mode, and the signal producing circuit 141c are responsive to the external test control signal at the control signal pin WEB and the control signals CL11 to CL13 for produces the first, second and third test control signals CL1 to CL3 at appropriate timings. If the address pin A(n+1) goes up over the positive power voltage level Vdd, the first test control signal CL1 goes down to the inactive low level.

Figure 5:
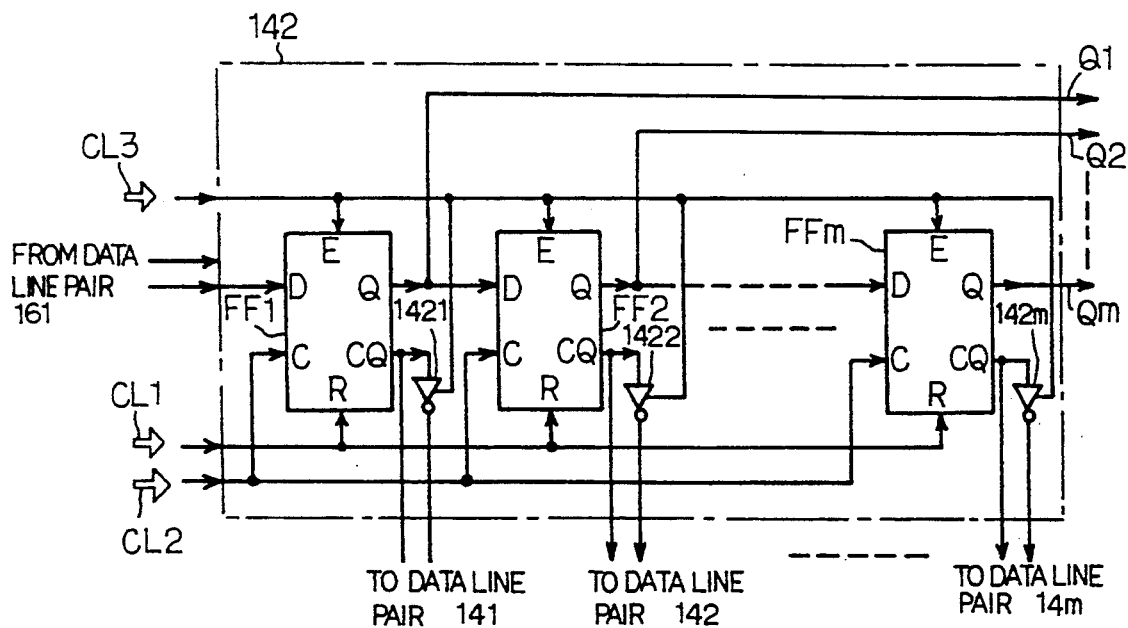
FIG. 5 is a circuit diagram showing the circuit arrangement of a shift register incorporated in the dynamic random access memory device according to the present invention.
Figure 6:
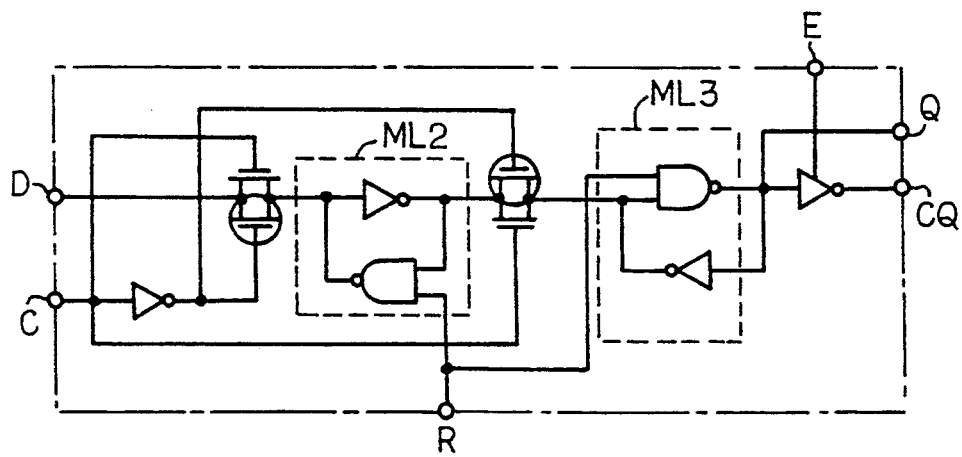
FIG. 6 is a circuit diagram showing the circuit arrangement of a flip-flop circuit forming a part of the shift register.

Turning to FIG. 5 of the drawings, the shift register 142 comprises a series of master-slave type flip-flop circuits FF1 to FFm and three-state inverters 1421, 1422 ... and 142m enabled with the third test control signal CL3. The flip-flop circuits FF1 to FFm are arranged as shown in FIG. 6, and each of the flip-flop circuits FF1 to FFm latches the voltage level on one of the data lines of the second data line pair 161 or at the output node Q of the previous stage in synchronism with the second test control signal CL2 at the clock node C. The voltage level at the input node D is stored in a memory loop ML2 consisting of an inverter and a NAND gate, and is transfers to a memory loop ML3 also consisting of an inverter and a NAND gate in synchronism with the next second control signal CL2. The voltage level thus stored in the memory loop ML3 is output from the output node Q through an associated signal line Q1, Q2 . . . or Qm to a first input node of the comparator 143 at all times. However, the complementary voltage signal is controlled with the third test control signal, and is output from the output node CQ directly to and through the three-state inverter 1421, 1422 or 142m to the associated first data line pair in response to the third test control signal CL3 at the output enable node E. The voltage level stored in the memory loop ML3 is canceled with the first test control signal CL1 at the reset node R.

Figure 7:
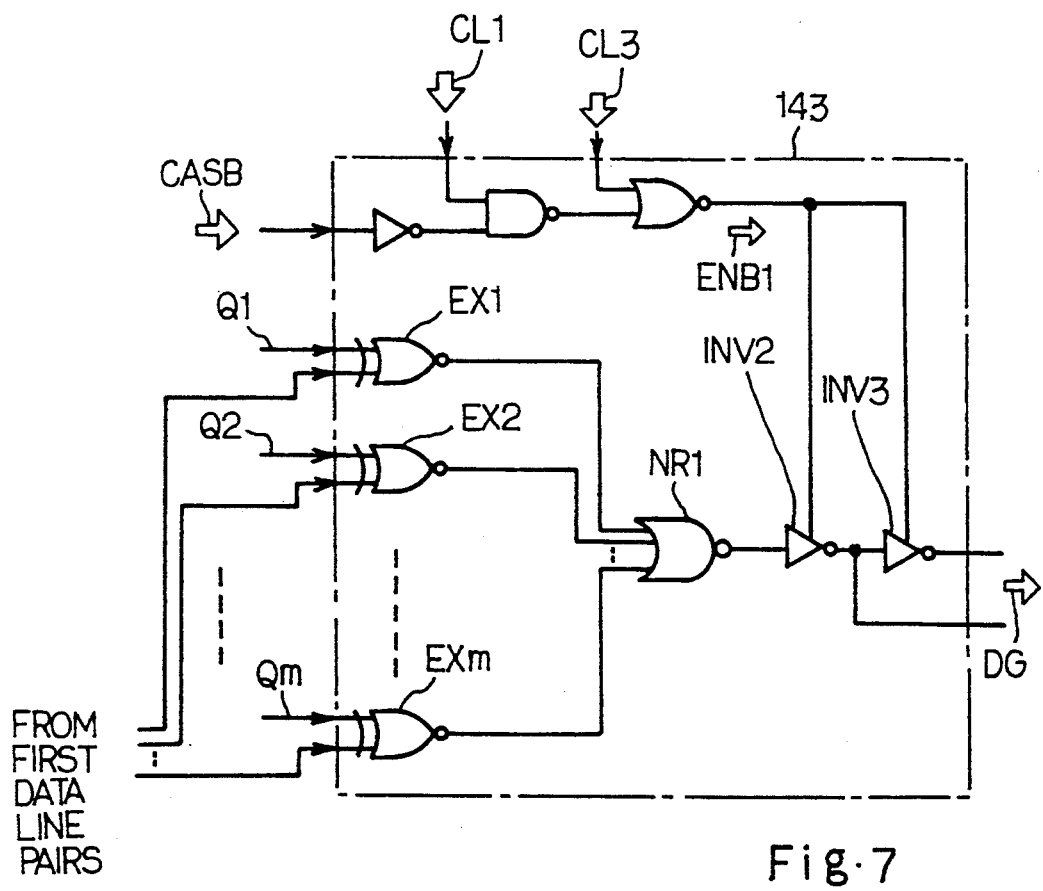
FIG. 7 is a circuit diagram showing the circuit arrangement of a comparator incorporated in the dynamic random access memory device according to the present invention.

FIG. 7 illustrates the circuit arrangement of the comparator 143, showing the first input nodes respectively connected with the signal lines Q1 to Qm, and second input nodes respectively connected with the first data lines respectively corresponding to the signal lines Q1 to Qm. Namely, the comparator 143 has a plurality of exclusive-OR gates EX1 to EXm each coupled with one of the signal lines Q1 to Qm and the corresponding first data line of one of the first data line pairs 141 to 14m, and a NOR gate NR1 checks the output signals of the exclusive-OR gates EX1 to EXm to see whether or not at least one test bit is inconsistent with the corresponding test bit. While the m-bit test data on the first data line pairs 141 to 14m is being consistent with the m-bit test data in the shift register 142, the NOR gate produces the output signal of logic "1" level equivalent to the high voltage level, and inverters INV2 and INV3 supply the diagnostic signal DG in the form of potential difference to the second data line pair 161 in response to an enable signal ENB1 produced in the concurrent presence of the first and third test control signal CL1 and CL3.

Figure 8:
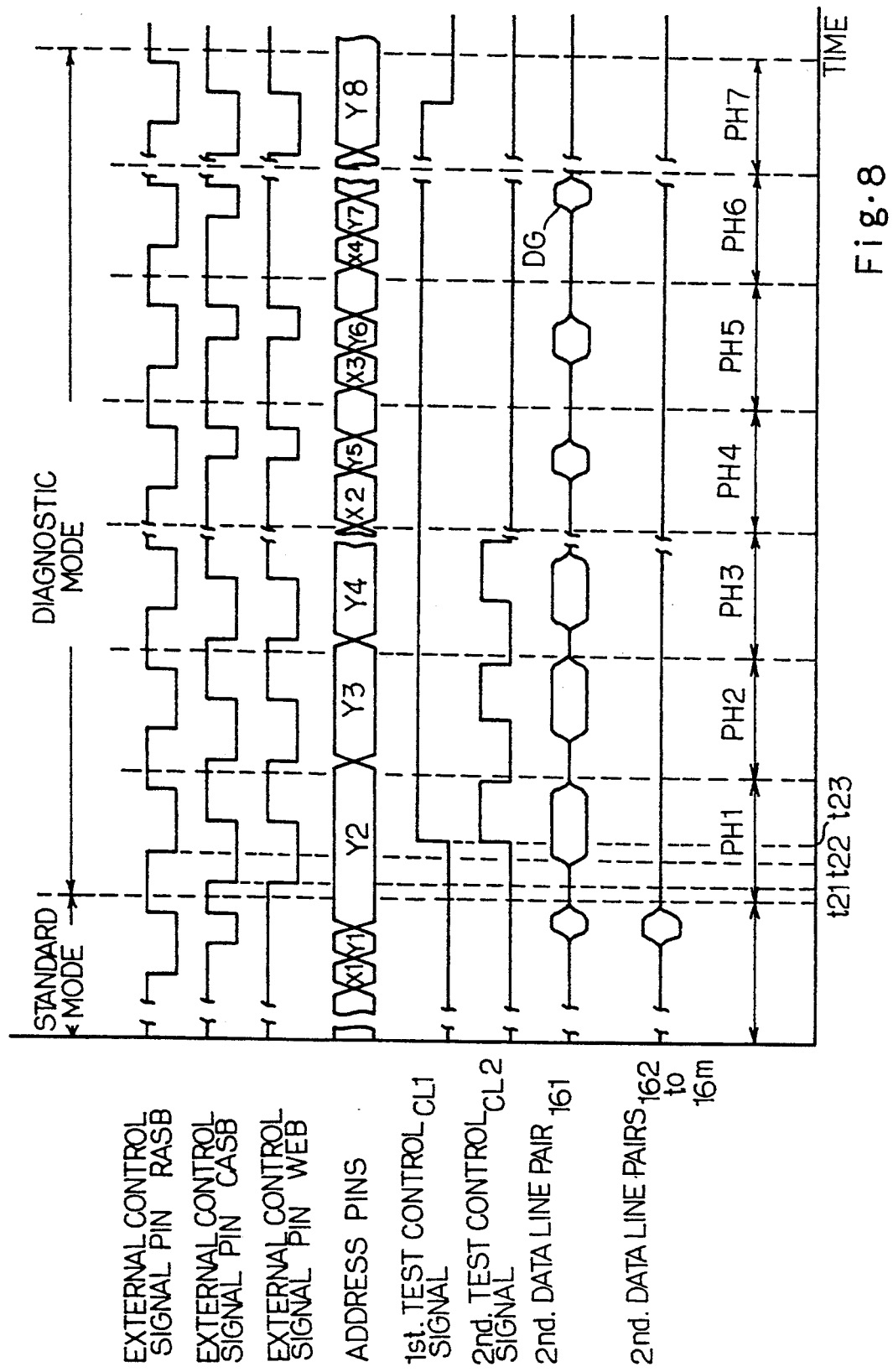
FIG. 8 is a timing chart showing a test sequence in a diagnostic mode for the dynamic random access memory device according to the present invention.

Description is made on the test sequence of the memory cell array 110 with reference to FIG. 8 of the drawings. The external test control signals at the pins CASB and WEB go down at time t21, and the external test control signal at the pin RASB goes down at time t22. The address pin Pn is lifted over the positive power voltage level Vdd, and the mode discriminating circuit 141a acknowledges the diagnostic mode. Therefore, the dynamic random access memory device enters the diagnostic mode in phase 1, and the first test control signal CL1 goes up at time t23. With the first test control signal CL1 of the high voltage level, all of the flip-flop circuits FF1 to FFm are reset, and the shift register enters ready state for storing test data bits. Moreover, the first test control signal CL1 causes the switching circuits 171 to 17m to isolates the first data line pairs 141 to 14m from the second data line pairs 161 to 16m.

The test data bits are serially supplied from the external diagnostic system to the input/output data pin 191, and are sequentially transferred from the second data line pair 161 to the input node D of the flip-flop circuit FF1. The test data bits are shifted from the flip-flop circuit FF1 to the flip-flop circuit FFm in synchronism with the second test control signal CL2 through phases 2 and 3, and an m-bit test data are finally stored in the shift register 142.

Though not shown in FIG. 8, when the m-bit test data is stored in the shift register 142, the third test control signal is changed to active level, and the flip-flop circuits FF1 to FFm concurrently supply the m-bit test data to the first data line pairs 141 to 14m. The m-bit test data is written into the memory cells of the memory cell sub-arrays 111 to 11m assigned the addresses identical with the addresses represented by the address signals at the address pins through phases 4 and 5.

The m-bit test data is read out from the memory cell sub-arrays 111 to 11m, and is transferred to the first data line pairs 141 to 14m. The comparator 143 compares the m-bit test data on the first data line pairs 141 to 14m with the m-bit test data in the shift register 142, and supplies the diagnostic signal DG through the second data line pair 161 and the input/output data buffer circuit 181 to the data pin 191 in phase 6.

The write-in cycle and read-out/comparing cycle are repeated, and the diagnostic system 140 diagnoses the memory cell array 110. Upon completion of the diagnosis, the external diagnostic system lifts the address pin A(n+1) over the positive power voltage level Vdd in phase 7, and the dynamic random access memory device is recovered to the standard mode.

As will be appreciated from the foregoing description, the shift register 141 and the comparator 143 allows the external diagnostic system to check the memory cell array 110 through a parallel testing operation even if the input/output data pins 191 to 19m are greater than the pins of the external diagnostic system.

Second Embodiment

Figure 9:
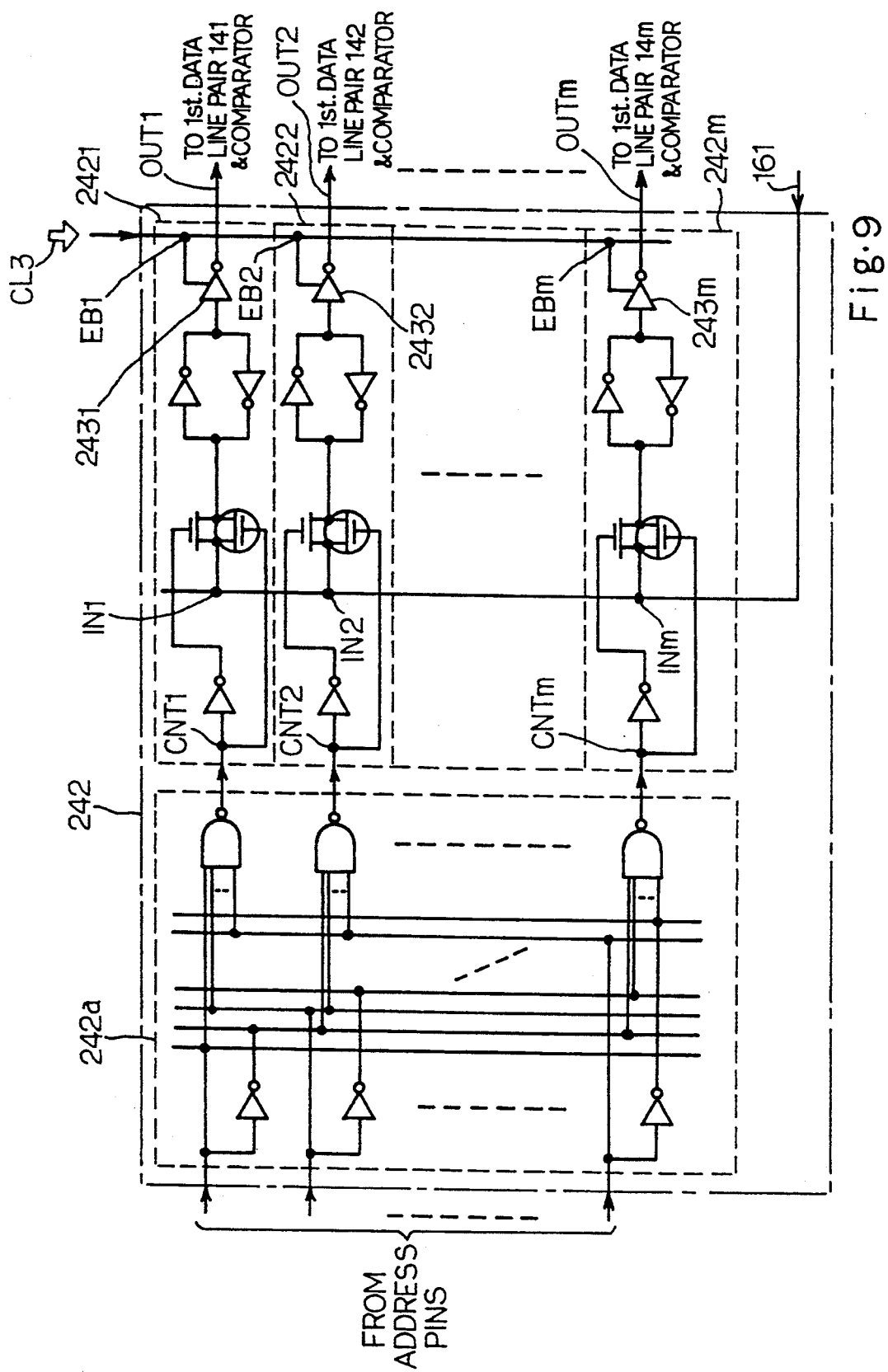
FIG. 9 is a circuit diagram showing the circuit arrangement of a shift register incorporated in another dynamic random access memory device according to the present invention.

Turning to FIG. 9 of the drawings, a write register 242 is incorporated in another dynamic random access memory device embodying the present invention instead of the shift register 142. The dynamic random access memory device implementing the second embodiment is similar to the first embodiment except for the write register 242, and any description is not made on the other components. However, the other components are labeled with the same references as those of the first embodiment in the following description.

The write register 242 comprises a decoder circuit 242a and a plurality of latch circuits 2421, 2422 . . . and 242m. The decoder circuit 242a is responsive to address signals supplied from the external diagnostic system (not shown) to the address pins, and selectively enables the latch circuits 2421 to 242m. The latch circuits 2421 to 242m have respective input nodes IN1 to INm coupled with one of the data lines of the second data line pair 161, respective control nodes CNT1 to CNTm coupled with the decoder circuit 242a, respective output enable nodes EB1 to EBm and respective output nodes OUT1 to OUTm respectively coupled with the first data line pairs 141 to 14m and the first input nodes of the comparator 143. Although FIG. 9 illustrates a set of three-state inverters 2431 to 243m, the latch circuits 2421 to 242m have two sets of three-state inverters, and supply m-bit test bits and the complementary bits thereof to the first data line pairs 141 to 14m in parallel.

The test bits are serially supplied through the input/output data pin 191, the input/output data buffer 181 and the second data line pair 161 to the write register 242, and the decoder circuit 242a sequentially enables the latch circuits 2421 to 242m so that the test bits are stored in the latch circuits 2421 to 242m.

When the m-bit test data is stored in the write register 242, the third test control signal CL3 is changed to the active level, and the m-bit test data is supplied to the first data line pairs 141 to 14m.

Since the latch circuits 2421 to 242m supply the test bits to the comparator 143, the comparator can compare the read out test bits with the test bits stored in the write register 242, and supplies the diagnostic signal DG to the second data line pair 161.

Thus, even if the signal pins are less than the input-/output data pins 191 to 19m, the external diagnostic system can make the inspection of the memory cell array 110.

Although particular embodiments of the present invention have been shown and described, it will be obvious to those skilled in the art that various changes and modifications may be made without departing from the spirit and scope of the present invention. For example, the internal serial-to-parallel conversion is available for any type of semiconductor memory device such as a static random access memory device. Moreover, the internal serial-to-parallel conversion may be parallelized so as to share the diagnosis on the test bits therebetween.

What is claimed is:

1. A semiconductor memory device selectively entering a standard mode and a diagnostic mode of operation, comprising:
   a) a plurality of memory cell arrays each having a plurality of addressable memory cells;
   b) an addressing system selecting one of said plurality of addressable memory cells from each of said plurality of memory cell arrays;
   c) a data propagation system having
      c-1) a plurality of first data bus means associated with said plurality of memory cell arrays, and respectively propagating data bits and test bits from and to said plurality of memory cell arrays in both standard and diagnostic modes of operation,
      c-2) a plurality of second data bus means respectively connectable with said plurality of second data bus means,
      c-3) a switching means operative to isolate said plurality of first data bus means from said plurality of second data bus means in said diagnostic mode and to transfer said data bits between said plurality of first data bus means and said plurality of second data bus means in said standard mode, and
      c-4) an input/output means operative to transfer said data bits in parallel to said plurality of second data bus means in said standard mode and to selectively transfer said test bits in serial to said plurality of second data bus means; and
   d) a diagnostic system having
      d-1) a controller responsive to external control signals for controlling a test sequence carried out in said diagnostic mode,
      d-2) a write register coupled with predetermined second data bus means supplied in serial with said test bits, and storing said test bits, said test bits being supplied in parallel to said plurality of first data bus means for writing said test bits into the memory cells respectively selected from said plurality of memory cell arrays in said diagnostic mode, and
      d-3) a comparator operative to compare said test bits read out in parallel from said plurality of memory cell arrays to said plurality of first data bus means with said test bits stored in said write register in said diagnostic mode to see whether or not said test bits on said plurality of first data bus means are consistent with said test bits in said write register, and supplying a diagnostic signal indicative of consistence or inconsistence to said predetermined second data bus means for outputting the diagnostic signal through said input-/output means.

2. The semiconductor memory device as set forth in claim 1, in which said plurality of memory cell arrays are of a dynamic random access memory.

3. The semiconductor memory device as set forth in claim 1, in which said controller acknowledges the diagnostic mode if the external control signals at first and second control signal pins were stepped down before the external control signal at a third control signal pin is stepped down for producing internal control signals, and is responsive to the internal control signals and the external control signals at first and second address pins for producing first to third test control signals.

4. The semiconductor memory device as set forth in claim 3, in which said write register comprises flip-flop circuits serving as shift stages coupled in cascade, each of said flip flop circuits having
   a reset node supplied with said first test control signal when said testing sequence is completed,
   an input node coupled with said predetermined second data bus means or a first output node of the flip flop circuit serving as a previous shift stage for serially receiving said test bits,
   a second output node complementary to said first output node,
   a clock node repeatedly supplied with said second test control signal for shifting said test bits serially supplied from said predetermined second data bus means, and an output enable node responsive to said third test control signal for allowing said second output node to output a complementary data bit of one of said test bits to one of said plurality of first data bus means when said test bits are stored in said plurality of flip-flop circuits.

5. The semiconductor memory device as set forth in claim 4, in which said comparator comprises
   a plurality of exclusive-OR gates each having a first input node coupled with the first output node of one of said flip-flop circuits and a second input node coupled with one of said plurality of first data bus means, and
   a logic gate means having a plurality of input nodes respectively coupled with output nodes of said plurality of exclusive-OR gates, and operative to produce said diagnostic signal supplied to said predetermined second data bus means.

6. The dynamic random access memory device as set forth in claim 1, in which said write register comprises
   a decoder circuit responsive to address signals sequentially changed for changing an address indicated by a latch control signal, and
   a plurality of latch circuits respectively assigned addresses, and responsive to said latch control signal for storing said test bits serially supplied from said predetermined second data bus means, said plurality of latch circuits being further responsive to an output enable signal for supplying said test bits in parallel to said plurality of first data bus means when said test bits serially supplied from said predetermined second data bus means are stored in said plurality of latch circuits.

* * * * *